United States Patent
Lee et al.

(10) Patent No.: US 7,211,371 B2
(45) Date of Patent: May 1, 2007

(54) METHOD OF MANUFACTURING A TFT ARRAY PANEL FOR A LCD

(75) Inventors: Chi-Shen Lee, Hsinchu (TW); Yung-Fu Wu, Hsinchu (TW); Chi-Lin Chen, Hsinchu (TW); Cheng-Chung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 495 days.

(21) Appl. No.: 10/673,326

(22) Filed: Sep. 30, 2003

(65) Prior Publication Data
US 2005/0048407 A1   Mar. 3, 2005

(30) Foreign Application Priority Data
Aug. 28, 2003   (TW) .............................. 92123831 A

(51) Int. Cl.
*G03F 7/00*   (2006.01)
(52) U.S. Cl. ...................... 430/314; 430/313; 430/317; 430/319; 430/321; 438/30
(58) Field of Classification Search .................... None
See application file for complete search history.

(56) References Cited

U.S. PATENT DOCUMENTS

| | | | | |
|---|---|---|---|---|
| 5,663,575 A | * | 9/1997 | Yamamura et al. | 257/59 |
| 6,822,702 B2 | * | 11/2004 | Chapman et al. | 349/43 |
| 2002/0093600 A1 | * | 7/2002 | Chol | 349/43 |

* cited by examiner

Primary Examiner—John A. McPherson
(74) Attorney, Agent, or Firm—Quintero Law Office

(57) ABSTRACT

A method of manufacturing a TFT array panel for a LCD disclosers that the gate electrode wiring, transparent conducting electrode, and the first electrode of the storage capacity are formed while the first mask is processing. Then, the selective deposition method is used to process the growth of the first metal wiring. This, therefore, can reduce the numbers of the mask processes. Further, the metal deposition with photo-resist lift-off step is used to implement the layout of the second metal wiring for the consequent transmission lines in the manufacturing process. Finally, the process of the passivation layer deposition is used to implement associated circuits of a TFT array panel for a LCD. The TFT array panel for a LCD for manufacturing circuits can simplify the manufacturing process and reduce the cost.

14 Claims, 6 Drawing Sheets

METHOD OF MANUFACTURING A TFT ARRAY PANEL FOR A LCD

BACKGROUND OF THE INVENTION

1. Field of the Invention

The present invention relates to a method of manufacturing a TFT array panel for a LCD. More particularly, the selective deposition and photo-resist lift-off techniques are used to implement the method of manufacturing a TFT-LCD array panel. By using the method for manufacturing a TFT-LCD array panel according to present invention, it can reduce and shorten the manufacturing process.

2. Description of the Related Art

Liquid crystal displays have the advantages of small volume, light weight, low power consumption, low radiation, excellent image quality, broad applications, and are widely applied in the consumer electronic products or computer products, such as medium to small portable TVs, mobile phones, camcorders, notebook computers, desktop computers and projection TVs, etc. However, the mass cost causing from manufacturing LCDs is a key for the development in the LCD field. In order to overcome the cost problem, most companies and producers focus on the issue of reducing manufacturing cost. The biggest portion of the total cost in a LCD is on the manufacturing process of the TFT-LCD array panel. According to above description, the present invention is to provide a method for simplifying the TFT-LCD array panel manufacturing process. Further, it can achieve the cost reduction thereto shorten the manufacturing process.

According to the conventional method for manufacturing a TFT-LCD array panel, the layout of the panel circuit has to be implemented through at least four masking processes. However, the more masking processes, the more manufacturing costs. In other words, it means the more exposing lithography and etching processes need to be processed. The steps can cause serious effect on the reliability of the components. Therefore, the present invention is to provide a method for manufacturing a TFT-LCD array panel. More particularly, the method uses a selective deposition process to implement. The metal wire can be formed by using the selective deposition process. The process with circuit layout can alternate the conventional technique which of using more masking process to form the metal wire with multi-layer. It, therefore, can simplify and shorten the manufacturing process.

Besides, the metal deposition and photo-resist lift-off steps are further used in the consequent process of the transmission line. By using the present invention, it provides a method of manufacturing a TFT-LCD array panel. Further, it can avoid the damage risk in the operational channel while performing an etching process.

SUMMARY OF THE INVENTION

It is an object of the present invention to provide a method for manufacturing a TFT-LCD array panel. More particularly, a selective deposition method is used herein. It can reduce the numbers of masking processes thereto implement the growth of the low resistance metal wire.

It is another object of the present invention to provide a method of manufacturing a TFT-LCD array panel. More particularly, a lift-off technique is used in the method, and also applied in the manufacture of any metal conducting layer. The present invention can be illustrated as shown in the growth of the second metal wire. This can, therefore, reduce the cost of etching process. Furthermore, it can avoid the damage risk in the operational channel while performing etching process.

More, one of the main objects of the present invention is to provide the circuit of a TFT-LCD array panel. More particularly, the conducting metal layer is formed by using a low-resistance metal. It can improve the RC delay effect while happening in a big area panel.

For a more complete understanding of the present invention and for further advantages thereof, reference is now made to the following description taken in conjunction with the accompanying drawing, in which:

DETAILED DESCRIPTION OF THE PREFERRED EMBODIMENTS

Figure 1A:
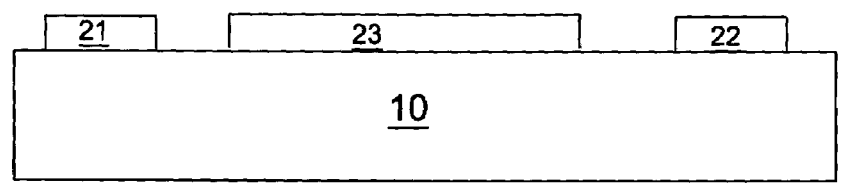
FIG. 1a is one of the preferred embodiments of the present invention showing metal wiring layout.

The present invention is to provide a method for manufacturing a TFT-LCD array panel. Please referring to FIG. 1a, it is one of the preferred embodiments of the present invention showing a metal conducting wiring layout. In the first masking process, a transparent conducting electrode material is formed on the substrate 10, and the gate electrode 21, a transparent conducting electrode 23, and a storage capacitor electrode 22 are defined. Then, the graph of the transparent conducting electrode and the layouts of the gate electrode and the storage capacitor electrode are independent. According to the character of connection between the gate electrode and the storage capacitor electrode, the selective deposition method is used to deposit a low-resistance metal or a multi-layer metal wiring layer with metal diffusion passivation. The deposited metal material herein is composed of the low resistance metal, such as Al, Cu, Ag, Mo, Cr, Ti, W, or other alloy materials. The selective deposition method uses the selective conducting current to deposit the low-resistance metal on the right position of the gate electrode, the storage capacitor electrode. Therefore, it does not require extra masking process to define the first metal wire. The transparent conducting electrode layer can be made of ITO or IZO.

Figure 1B:
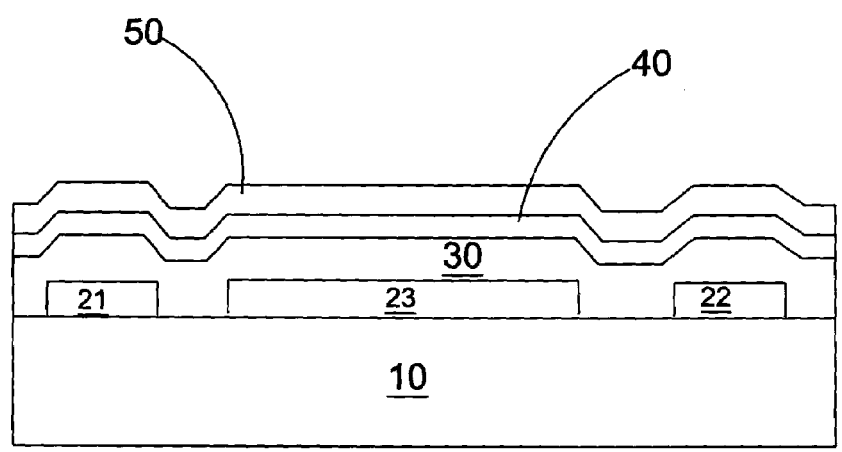
FIG. 1b is one of the preferred embodiments of the present invention showing the deposition method used to form a dielectric layer and an A-Si layer, or a poly-Si layer.
Figure 1C:
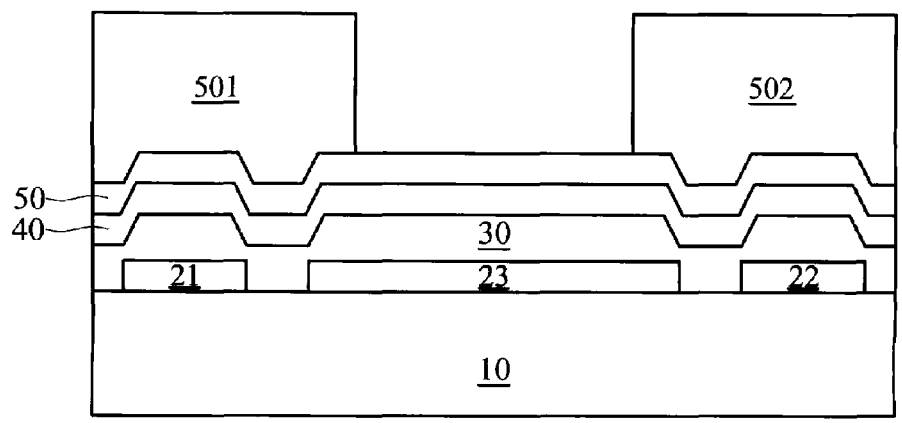
FIG. 1c is one of the preferred embodiments according to the present invention showing the contact window in the masking process.
Figure 1D:
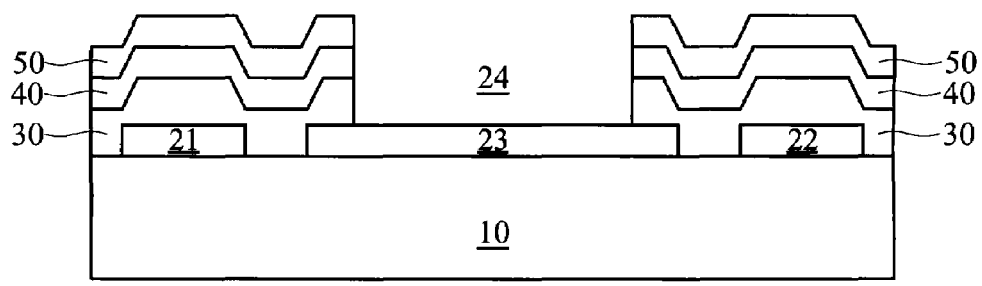
FIG. 1d is one of the preferred embodiments according to the present invention showing a liquid crystal contact window formed by an etching technique.

Accordingly, please referring to FIG. 1b, a dielectric layer, an A-Si layer and a poly-Si layer are deposited as shown in the figure. Further, a dielectric layer 30, and an A-Si layer 40 and a poly-Si layer 50 are deposited in order, and are covered on the substrate 10, the gate electrode 21, the storage capacitor electrode 22 and the transparent conducting layer 23. Then, performing the second masking process. Please referring to FIG. 1c, it is one of the preferred embodiments according to the present invention showing the contact window in the masking process. Firstly, photo-resists 501, and 502 are used to shield the outside of the transparent conducting electrode 23. Then, the contact window 24 is defined in the masking process. Please referring to FIG. 1d, it is one of the preferred embodiments according to the present invention showing the contact window formed in the etching process. Then, the photo-resists 501, 502 are removed. More, the deposition method forming an A-Si layer, a transparent conducting electrode, or a gate electrode can use PVD, low pressure CVD, or plasma enhanced CVD to implement.

Figure 1E:
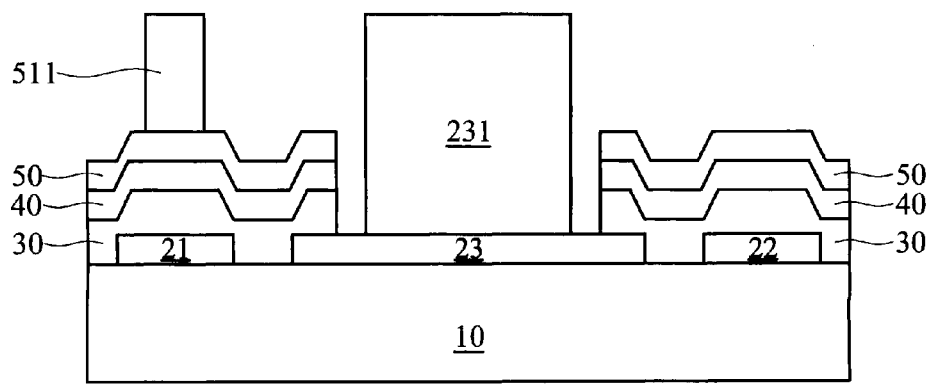
FIG. 1e is one of the preferred embodiments according to the present invention showing the source electrode and the drain electrode.
Figure 1F:
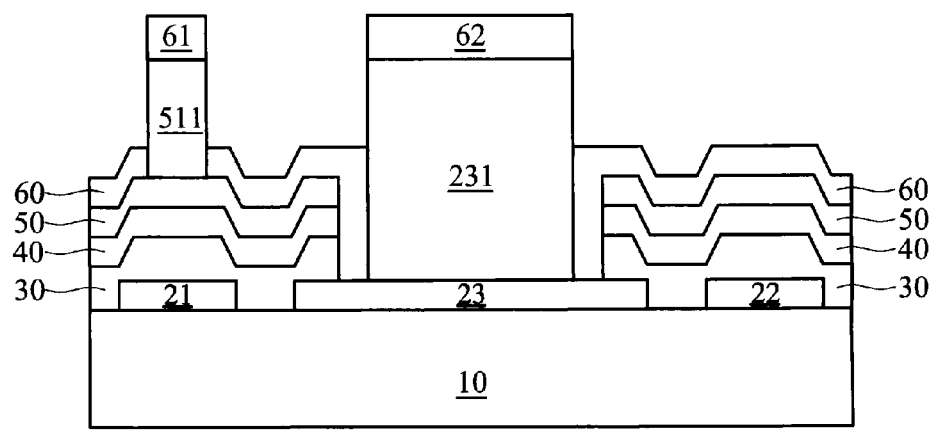
FIG. 1f is one of the preferred embodiments according to the present invention showing the deposition of the second metal wire.

Further, the source electrode and the drain electrode are defined. Please referring to FIG. 1e, it is one of the preferred embodiments according to the present invention showing the source electrode and drain electrode. The photo-resists 511, 231 are used to define the source electrode and the drain electrode in the third masking process. Then, performing metal layer deposits with a low-resistance metal or a diffusion material, but not removes the photo-resists 511, 231. Please referring to FIG. 1f, it is an example of the present invention showing the metal deposition process, herein said metal is Cu. Cu is deposited on the photo-resists 61, 62 and on the place 60 without photo-resist covering.

Figure 1G:
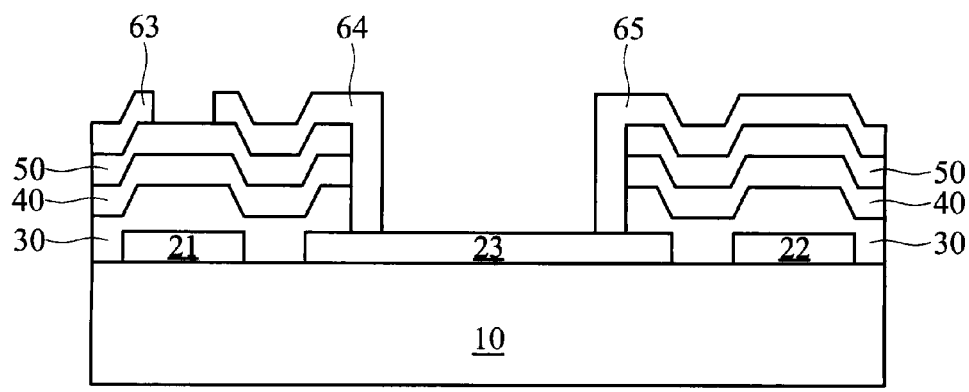
FIG. 1g is one of the preferred embodiments according to the present invention showing the photo-resist lift-off process.
Figure 1H:
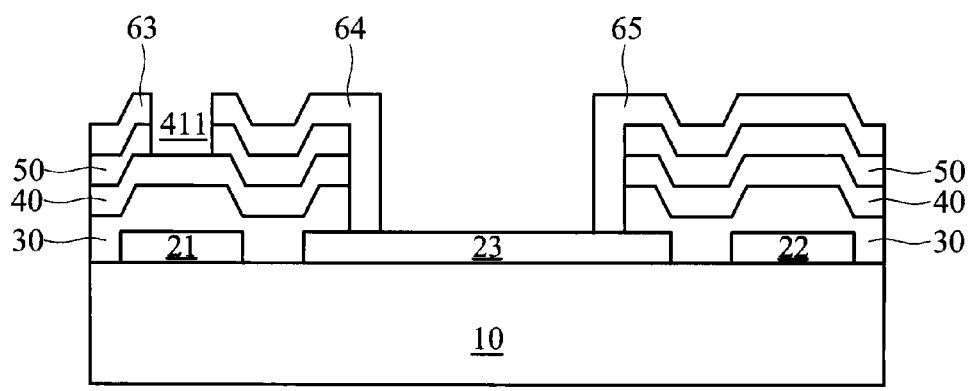
FIG. 1h is one of the preferred embodiments according to the present invention showing the channel of the components in the etching process.

Further, it presents a photo-resist lift-off process. Please referring to FIG. 1g, it is one of the preferred embodiments according to the present invention showing a photo-resist lift-off process for implementing the deposition of the second metal wiring. Then, it uses the poly-Si layer 50 with etching technique to block the channel of the source and drain electrodes thereto the operational channel 411. Please referring to FIG. 1h, it is one of the preferred embodiments showing the operational channel according to the present invention. The second metal wire can be made of the low-resistance metal materials, such as Al, Cu, Ag, Mo, Cr, Ti, W, or the induced material such as diffusion, and adhesion with multi-layer structure of the metal material.

Figure 1I:
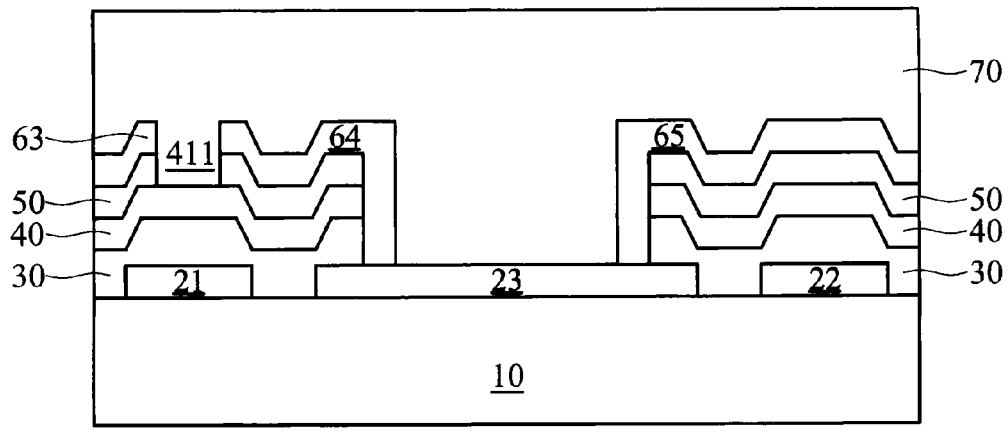
FIG. 1i is one of the preferred embodiments according to the present invention showing a passivation layer.
Figure 1J:
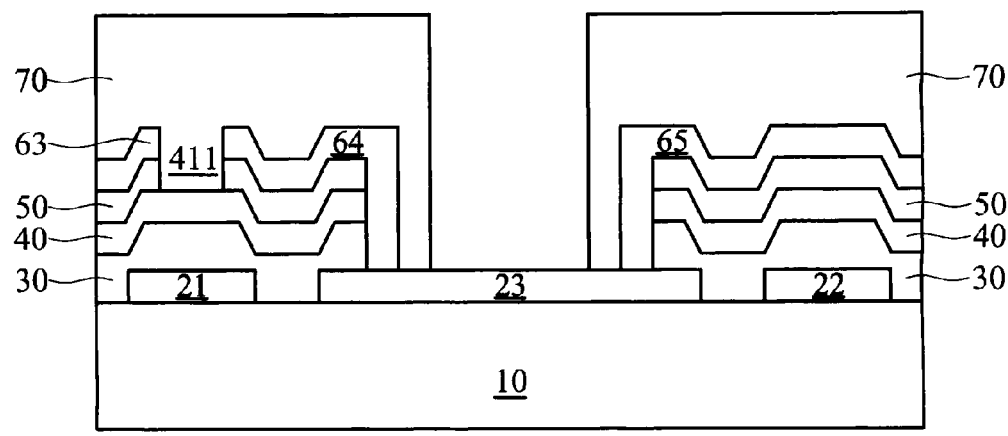
FIG. 1j is one of the preferred embodiments according to the present invention showing a thin-film transistor.

Finally, the fourth masking process is discussed herein. The passivation layer 70 of the deposition component can be made of $SiO_2$ or silicon nitride. Please referring to FIG. 1i, the passivation layer is shown herein. In the final masking process, the liquid crystal contact window 24 is formed to implement the TFT-LCD array panel according to the present invention as shown in FIG. 1j.

Figure 2:
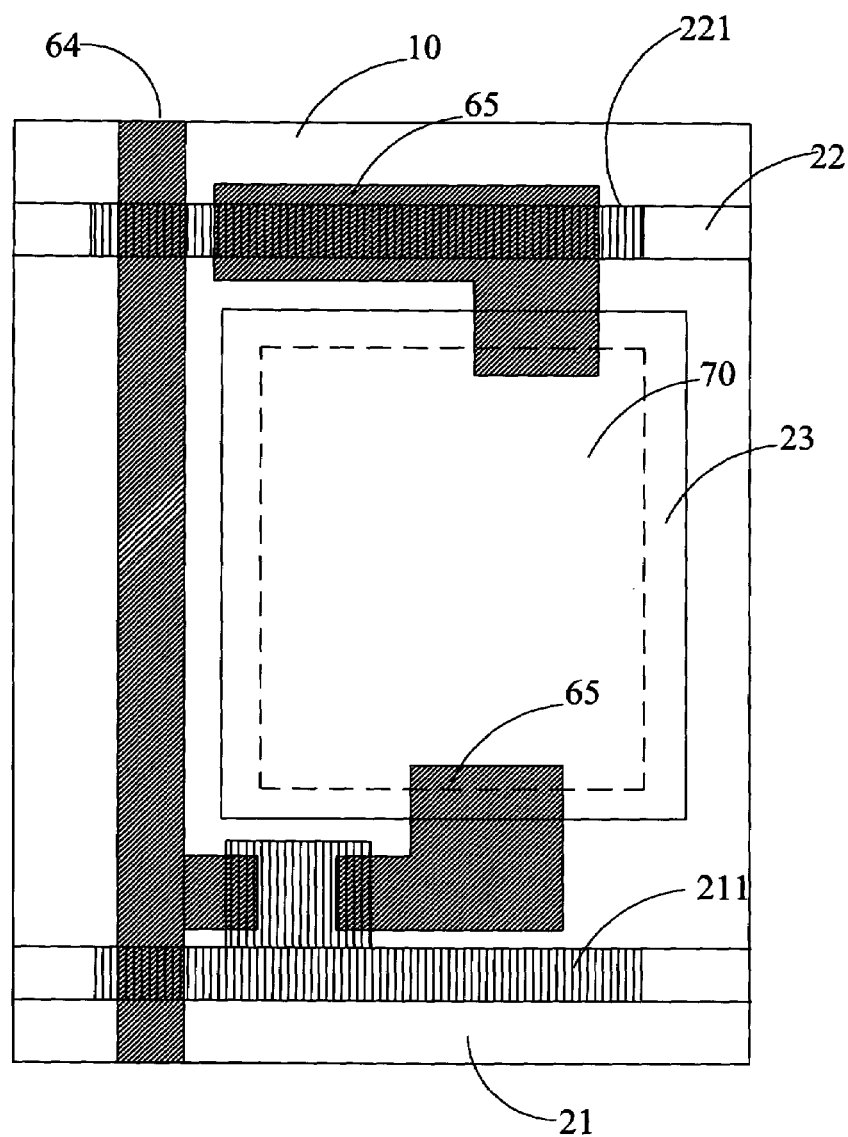
FIG. 2 is one of the preferred embodiments according to the present invention showing the circuit layout of the pixel electrode.

For further description, the present invention is to provide a method of manufacturing a TFT-LCD array panel. The method can be applied in the pixel electrode circuit of a TFT-LCD array panel. Please referring to FIG. 2, it presents the circuit layout of the pixel electrode. It comprises a transparent conducting electrode 23, a gate electrode 21, and a storage capacitor electrode 22. Also, they are formed on the substrate 10 in the first masking process. Then, using the selective sputtering method deposits the first metal wires 211, 221. Further, the contact window of the transparent conducting electrode is implemented in the in the second masking process. More, the depositions of the second metal wires 63 64, 65 are implemented in the third masking process. Finally, the deposition of the passivation layer 70 is implemented for forming a pixel electrode.

Furthermore, the present invention relates to a method of manufacturing a TFT-LCD array panel. The transparent conducting metal layer is defined in the first masking process. More, the low-resistance gate electrode, the metal wiring layout of the storage capacitor electrode is implemented by the selective deposition method.

Further, the present invention provides a method of manufacturing a TFT-LCD array panel, wherein the metal wire of the second layer is as a hard mask to process in the operational channel, and does not require extra masking process to implement.

In conclusion, the present invention meets novelty, improvement, and is applicable to the industry. It, therefore, meets the essential elements in patentability. There is no doubt that the present invention is legal to apply to the patent, and indeed we hope that this application can be granted as a patent.

Although the present invention has been described in detail with respect to alternate embodiments, various changes and modifications may be suggested to one skilled in the art, and it should be understood that various changes, suggestions, and alternations can be made hereto without departing from the spirit and scope of the invention as defined by the appended claims.

What is claimed is:

1. A method of manufacturing a TFT array panel of a liquid crystal display, said method comprising the steps of:
   forming a substrate, a transparent conducting metal layer being formed on the substrate, and then a first masking process being processing for defining at least a gate electrode, a storage capacitor electrode, and a transparent conducting electrode;
   forming a first metal wiring layer by using a selective deposition method for implementing a wiring layout of the gate electrode, the storage capacitor electrode, a dielectric layer, an A-Si layer, and a poly-Si layer being deposited in order;
   processing a second masking process to form the a contact window of the transparent conducting electrode;
   processing a third masking process for defining a source/drain, and depositing a second metal wiring layer;
   etching the poly-Si layer, and channeling the first metal wiring layer and the second metal wiring layer; and
   processing deposition to form a passivation layer, and disclosing the parts of the transparent conducting electrode.

2. The method of manufacturing TFT-LCD array panel according to claim 1, wherein said transparent conducting metal layer is made of ITO or IZO.

3. The method of manufacturing TFT-LCD array panel according to claim 1, wherein said first metal wiring layer is made of Al, Cu, Ag, Mo, Cr, Ti, W, or other alloy materials.

4. The method of manufacturing TFT-LCD array panel according to claim 1, wherein the first metal wiring layer is a multi-layer metal wiring layer.

5. The method of forming TFT-LCD array panel according to claim 1, wherein said second metal wiring layer is made of Al, Cu, Ag, Mo, Cr, Ti, or W.

6. The method of forming TFT-LCD array panel according to claim 1, wherein the first masking process, the second masking process and the third masking process, include lithography etching.

7. The method of manufacturing a TFT-LCD array panel according to claim 1, wherein the deposition method of the A-Si layer, the transparent conducting layer, or gate electrode uses PVD, Low pressure CVD, or plasma enhanced CVD.

8. The method of manufacturing a TFT-LCD array panel according to claim 1, wherein the selective deposition method uses the a selective conducting wiring layout to deposit metal.

9. The method of manufacturing a TFT-LCD array panel according to claim 1, wherein the passivation layer can be made of $SiO_2$, silicon nitride material, organic materials.

10. The method of forming TFT-LCD array panel according to claim 1, wherein said second metal wiring layer is made of alloy material.

11. The method of forming TFT-LCD array panel according to claim 1, wherein said second metal wiring layer is made of alloys of Al, Cu, Ag, Mo, Cr, Ti, or W.

12. The method of forming TFT-LCD array panel according to claim 1, wherein said second metal wiring layer is made of low resistance materials.

13. The method of forming TFT-LCD array panel according to claim 1, wherein said second metal wiring layer is a multilayer structure.

14. The method of forming TFT-LCD array panel according to claim 1, wherein said second metal wiring layer is a multilayer structure comprising Al, Cu, Ag, Mo, Cr, Ti, or W.

* * * * *